United States Patent [19]

Lee

[11] 4,383,305
[45] May 10, 1983

[54] SIMULATION CIRCUIT EMPLOYING SWITCHED CAPACITORS

[75] Inventor: Man S. Lee, Belmont, Calif.

[73] Assignee: GTE Automatic Electric Laboratories, Inc., Northlake, Ill.

[21] Appl. No.: 219,035

[22] Filed: Dec. 22, 1980

[51] Int. Cl.³ .................... G06G 7/62; H03H 11/00
[52] U.S. Cl. ................................ 364/802; 333/214; 364/861
[58] Field of Search ............... 364/802, 825; 333/214, 333/215, 109; 328/167; 307/109, 110

[56] References Cited

U.S. PATENT DOCUMENTS 4,168,440  9/1979  Gray ............................. 333/214 X
4,333,157  6/1982  Lee ................................... 364/802

OTHER PUBLICATIONS

Temes et al.: Switched-Capacitor Circuits Bilinearly Equivalent to Floating Inductor, Electronics Letters, Feb. 1, 1979, vol. 15, No. 3, pp. 87/88.
Lee: Switched-Capacitor Filters Using Floating Inductance Simulation Circuits, Electronics Letters, Sep. 27, 1979, vol. 15, No. 20, pp. 644/645.
Lee: Improved Circuit Elements for Switched-Capacitor Ladder Filters, Electronics Letters, Feb. 14, 1980, vol. 16, No. 4, pp. 131/133.
Seneni et al.: New Canonic Active RC Realizations of Grounded and Floating Inductors, Proceedings of the IEEE, vol. 66, No. 7, Jul. 1978, pp. 803/804.
Viswanathan et al.: Switched-Capacitor Transconductance and Related Building Blocks IEEE Transactions on Circuits and Systems, vol. CAS-27, No. 6, Jun. 1980, pp. 502/508.

Primary Examiner—Felix D. Gruber
Attorney, Agent, or Firm—Russell A. Cannon

[57] ABSTRACT

A circuit for simulating the parallel combination of a floating inductor and capacitor in the bilinear and LDI domains has a pair of nodes receiving an input voltage and connected to input terminals of associated first and second voltage followers. A first capacitor C1 is alternately or periodically connected across the output terminals of the voltage followers for sampling the input voltage, and connected between the output of the second voltage follower and the input terminal of an integrator including a second capacitor C2 which integrates and stores the charge voltage on C1. A third capacitor is periodically connected to the nodes for sampling the input voltage, and connected between the output terminals of the first voltage follower and the integrator for subsequently also sampling and storing the integrated voltage on C2. The sum of the input voltage and the integrated voltage that is stored by C3 is discharged to the new input voltage when C3 is again connected across the nodes. The parallel combination of a grounded inductor and capacitor is simulated by replacing one of the voltage followers with a short circuit and connecting the associated node to ground. An inductor alone is simulated across the nodes by proper selection of values of the three capacitors.

27 Claims, 3 Drawing Figures

SIMULATION CIRCUIT EMPLOYING SWITCHED CAPACITORS

BACKGROUND OF INVENTION

This invention relates to switched capacitor circuits or networks for simulating electrical impedance elements, and more particularly to a switched capacitor circuit replacement for an inductor and/or the parallel combination of an inductor and a capacitor.

A switched capacitor floating-inductor simulation circuit that is relatively insensitive to parasitic capacitance is described in the article "Switched Capacitor Filters Using Floating-Inductance Simulation Circuits" by Man Shek Lee, Electronics Letters, Sept. 27, 1979, Vol. 15, No. 20, pages 644–645, and in the U.S. patent application "Switched-Capacitor Floating-Inductor Simulation Circuit" by Man Shek Lee, Ser. No. 162,981, Filed June 25, 1980, U.S. Pat. No. 4,333,157, Issued Jun. 1, 1982, both of which are incorporated herein by reference. The inductor simulation circuit described there requires matched capacitors, however, to simulate a truly floating lossless inductor or impedance. It is desirable to have switched capacitor types of simulation circuits that do not depend on the matching of components. An object of this invention is the provision of a switched capacitor circuit that does not require matching of components to simulate a desired impedance. Another object is the provision of a switched capacitor circuit that simulates an inductor. A further object is the provision of such a circuit that simulates the parallel combination of an inductor and a capacitor.

SUMMARY OF INVENTION

In accordance with this invention, an integratable switched capacitor circuit for simulating an impedance element comprises: a pair of nodes adapted for receiving an input voltage; voltage follower means having an input terminal connected to one of the nodes and having an output terminal; capacitors C1 and C3; integrator means including a second capacitor C2; switch means associated with C1 and C3 and being periodically operative in first and second switch states; and means for coupling the switch means to the other node; operation of the switch means in the first state electrically connecting C1 between the output terminal of the voltage follower means and the coupling means for sampling and storing an input voltage, and electrically connecting C3 across the nodes for sampling the input voltage; operation of the switch means in the second state electrically connecting C1 to the integrator means for causing it to integrate the charge voltage stored on C1, and electrically coupling C3 between the output terminal of the integrator means and one of the output terminal of the voltage follower means and the coupling means for causing C3 to also sample the integrated voltage; the sum of the input voltage and the integrated voltage that is stored by C3 being discharged to a new input voltage when the switch means subsequently operates in the next first state which again connects C3 across the nodes. The circuit may simulate the parallel combination of a floating inductor and a capacitor, or a floating inductor alone, when the coupling means comprises a second voltage follower means. Conversely, the circuit may simulate a grounded inductor in parallel with a capacitor, or a grounded inductor alone, when the coupling means connects the other node to ground.

DESCRIPTION OF DRAWING

This invention will be more fully understood from the following detailed descriptions of preferred embodiments thereof, together with the drawing in which.

DESCRIPTION OF PREFERRED EMBODIMENTS

This invention is described in the article "Improved Circuit Elements for Switched-Capacitor Ladder Filters" by Man Shek Lee, Electronics Letters, Feb. 14, 1980, Vol. 16, No. 4, pages 131–133, which is incorporated herein by reference.

Figure 1:
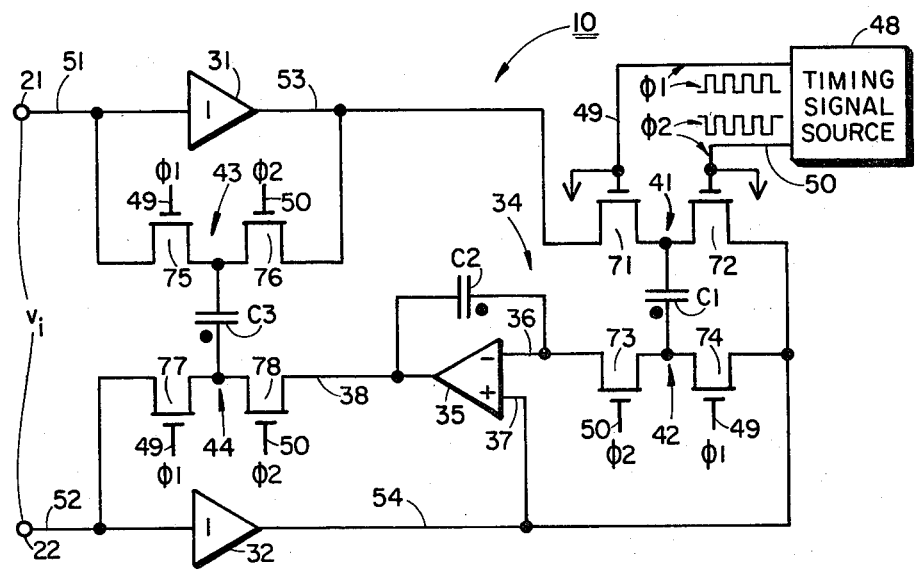
FIG. 1 is a schematic circuit diagram of a preferred embodiment of this invention for simulating the parallel combination of a floating inductor and capacitor.

Referring now to FIG. 1, the switched capacitor circuit 10 here for simulating the parallel combination of a floating inductor and capacitor across a pair of nodes 21 and 22 thereof is preferably implemented in fully integrated circuit form. The switched capacitor circuit comprises a pair of voltage follower circuits 31 and 32; an active integrator circuit 34; a pair of integrated capacitors C1 and C3; and a plurality of transistor switch means 41–44 for making desired connections to the capacitors C1 and C3. The dots adjacent one sides of integrated capacitors indicate the locations of the top plates thereof.

The integrator circuit 34 comprises an integrated capacitor C2 and an integrated differential input operational amplifier 35 which is essentially a voltage controlled voltage source having a very low output impedance, a very high input impedance, and providing whatever output current is demanded by external circuitry. The non-inverting input line 37 is directly electrically connected to the output terminal of voltage follower 32. The integrating capacitor C2 is connected across the amplifier with the top and bottom plates connected to its input line 36 and output line 38, respectively. Consideration of this integrated structure reveals that the bottom plate parasitic capacitance of C2 cannot change the ouptut impedance of amplifier 35 since this impedance is already substantially zero ohms. This means that the switched capacitor circuit 10 is generally insensitive to the bottom plate parasitic capacitance effects of C2. Since the parasitic capacitance associated with the top plate of integrated capacitors is generally very low, its effect on the operation of the circuit is negligible.

Each of the voltage follower circuits 31 and 32 may be an integrated differential input operational amplifier having its non-inverting input connected to an associated one of the nodes and its output directly electrically connected to the inverting input thereof. These voltage followers are essentially voltage controlled voltage sources that have very high input impedance and very low output impedances. Alternatively, the circuits 31 and 32 can be other types of voltage followers. Since the gain of a voltage follower is by definition substantially unity, the voltage between lines 53 and 54 is substantially equal to an input voltage $v_i$ that is connected across the nodes 21 and 22.

In an integrated circuit embodiment of the circuit 10 that is implemented with MOS technology, each of the switch means 41–44 comprises a pair of series-connected MOS FET transistors having gate electrodes that are driven by different ones of a pair of two phase non-overlapping digital timing control signals $\phi 1$ and $\phi 2$ that are produced by a source 48. That is, assuming that the switches are turned on by a positive signal, the positive portions of the control signals $\phi 1$ and $\phi 2$ are non-overlapping, although the negative portions of these control signals may overlap. The transistors 71 and 72 are connected in series between the output terminals of the voltage followers 31 and 32 whereas the transistors 73 and 74 are connected in series between the inverting input of amplifier 34 and the output terminal of voltage follower 32. The pair of switching transistors 75 and 76 are connected in series across the voltage follower 31, whereas the transistors 77 and 78 are connected in series between the node 22 and the output terminal of the integrator. The intermediate terminal between the transistors of each switch means is connected to a side of an associated integrated capacitor. The control signals $\phi 1$ and $\phi 2$ are 180° out of phase with each other in FIG. 1, and preferably have a 50% duty cycle. The switching frequency $f_s$ of the control signals is $f_s = 1/T$, where T is the period of a switching cycle. It is known that the switching frequency should be greater than the Nyquist sampling rate.

In operation, switching transistors 71 and 74 are poled for connecting C1 between the output lines 53 and 54 of the voltage followers when the control signal $\phi 1$ is high. This causes C1 to sample an input voltage $v_i$ that is applied to the nodes 21 and 22. The transistors 75 and 77 are also caused to conduct when $\phi 1$ is high for connecting C3 across the input nodes for causing it to charge to the input voltage. When $\phi 2$ subsequently goes high, transistors 72 and 73 conduct to connect C1 between the inverting input of the amplifier and the output of voltage follower 32. This causes the charge on C1 to be transferred to C2 so that the input voltage is integrated by the circuit 34 and stored on C2. The transistors 76 and 78 also conduct in response to this positive voltage in $\phi 2$ for connecting C3 between the output terminal of the integrator and the output terminal of the other voltage follower 31. This causes C3 to also sample the integrated input voltage which is stored on C2. When $\phi 1$ next goes high, transistors 75 and 77 again connect C3 across the nodes 21 and 22 for enabling C3 to charge (or discharge) in a positive or negative direction from the sum of the previously sampled input voltage and the integrated voltage to the new value of input voltage that is now present on the nodes 21 and 22. This creates a current in lines 51 and 52 that has an average value that is related to the integral of the input voltage $v_i$ and the derivative thereof so that this circuit effectively simulates the parallel combination of a discrete time domain inductor and capacitor between nodes 21 and 22.

The aforementioned operation of switch means 41 and transistors 71 and 72 connects the bottom plate of integrated capacitor C1 between the output terminals of voltage sources 31 and 32 so that the bottom plate parasitic capacitance of C1 does not have a deleterious effect on the operation of the circuit. Consideration of the circuit 10 reveals that the bottom plate parasitic capacitance of C3 may have an effect on the circuit operation when the circuit is considered by itself. In a network employing the circuit 10, however, an external capacitance is normally connected between node 21 and ground. The value of this external capacitance may be adjusted in order to compensate for the parasitic capacitance associated with the bottom plate of C3 so that it will not have an adverse effect on the operation of the circuit 10. Thus, the switched capacitor circuit 10 will be generally insensitive to bottom plate capacitance effects in a network employing it.

The lossless discrete integrator (LDI) and the bilinear transformations are commonly used in deriving a discrete time domain filter from a continuous time domain filter. The LDI (Loss less Discrete Integrator) and bilinear transformations are $$s \to \frac{1}{T}(z^{\frac{1}{2}} - z^{-\frac{1}{2}}) \tag{1}$$

and $$s \to \frac{2}{T} \frac{(1 - z^{-1})}{(1 + z^{-1})} \tag{2}$$

where T is the sampling period and $z = e^{st}$. In circuits characterized by both the LDI and the bilinear transformations, the differential charge-voltage relationship for a capacitor is $$\Delta Q(z) = C(1 - z^{-1}) V(z) \tag{3}$$

The charge-voltage relationship for an inductor that is characterized by the LDI transformation is $$\Delta Q(z) = \frac{T^2}{L} \frac{z^{-1}}{(1 - z^{-1})} V(z) \tag{4}$$

where L is inductance. The charge-voltage relationship for an inductor that is characterized by the bilinear transformation, however, is $$\Delta Q(z) = \frac{T^2}{4L} \frac{(1 + z^{-1})^2}{(1 - z^{-1})} V(z) \tag{5}$$

Substituting the algebraic identity $$z^{-1} = \frac{1}{4}(1 + z^{-1})^2 - \frac{1}{4}(1 - z^{-1})^2 \tag{6}$$

in equation 4, the relationship in equation 4 for an inductor may be rewritten as $$\Delta Q(z) = \frac{T^2}{4L} \frac{(1 + z^{-1})^2}{(1 - z^{-1})} V(z) - \frac{T^2}{4L}(1 - z^{-1})V(z) \tag{7}$$

for the LDI transformation. Comparing the expressions in equations 3, 5 and 7, it will be noted that an inductor in the LDI domain (equation 7) is equivalent to an impedance element in the bilinear transformed domain comprising the parallel combination of an inductor of the same value L (equation 5) and a capacitor having a negative capacitance $-T^2/4L$ (equation 3).

In framing an analysis of the switched capacitor circuit in FIG. 1, it is assumed that the parasitic capacitance associated with the switch means and the top plates of the integrated MOS capacitors are small and the effects thereof negligible. The bottom plate parasitic capacitances of C1 and C2 also have no effect on the operation of the circuit since C1 is switched between the output terminals of voltage follower types of voltage sources 31 and 32, and C2 is driven by a voltage source 34. Since the bottom plate parasitic capacitance of C3 is equivalent to a fixed capacitor connected between the node 21 and ground, its effects can readily be compensated for by incorporating it into an external capacitor that is also connected between node 21 and ground. The effects of the bottom plate parasitic capacitances of C1, C2 and C3 are therefore also omitted in the following analysis.

Considering now the circuit in FIG. 1, the differential charge in line 51 between adjacent sample times is $$\Delta q(nT) = q(nT) - q(nT - T) \quad (8)$$
$$= C3(v_i(nT) - v_i(nT - T)) + C3\, v_o(nT - T)$$

where $v_o$ is the voltage across C2 of the integrator 34 (which is also the difference between the voltages measured between ground and lines 38 and 54), $q(nT)$ is the net charge in line 51 from time $-\infty$ to time nT, and $q(nT-T)$ is the net charge in line 51 from time $-\infty$ to time $(nT-T)$. The differential charge in line 52 during this time interval is also defined by equation 8. Recognizing that the voltage $v_o$ on the integrator is the integral of the input voltage $v_i(t)$ between the lines 51 and 52, and also between lines 53 and 54, these voltages are related in the expression $$C2(v_o(nT-T)-v_o(nT-2T))=C1\, v_i(nT-T) \quad (9)$$

for the differential charge in the integrated capacitor C2. Applying the z-transform to equations 8 and 9, one obtains the expressions $$\Delta Q(z)=C3(1-z^{-1})\, V_i(z)+C3\, z^{-1}\, V_o(z) \quad (10)$$

and $$C2(1-z^{-1})(z^{-1})\, V_o(z)=C1\, z^{-1}\, V_i(z) \quad (11)$$

Solving for the output voltage in equation 11, one obtains $$V_o(z) = \frac{C1}{C2}\, \frac{1}{(1-z^{-1})}\, V_i(z) \quad (12)$$

Substituting equation 12 into equation 10, one obtains the desired differential charge-voltage relationship $$\Delta Q(z) = \frac{C1C3}{C2}\, \frac{z^{-1}}{(1-z^{-1})}\, V_i(z) + C3(1-z^{-1})\, V_i(z) \quad (13)$$

for the simulation circuit in FIG. 1. Comparing equation 13 with equations 3 and 4 reveals that the circuit in FIG. 1 simulates an LDI impedance element having an inductance $T^2C2/C1C3$ in parallel with a capacitance C3. By substituting equation 6 into equation 13, one obtains the relationship $$\Delta Q(z) = \frac{C1C3}{4C2}\, \frac{(1+z^{-1})^2}{(1-z^{-1})}\, V_i(z) + \left(C3 - \frac{C1C3}{4C2}\right)(1-z^{-1})\, V_i(z) \quad (14)$$

Comparing equation 14 with equations 3 and 5 reveals that this same circuit 10 in FIG. 1 also simulates a bilinear impedance element consisting of an inductance $T^2C2/C1C3$ that is connected in parallel with a capacitance $C3-C1C3/4C2$. This circuit has particular advantage since it does not depend on the matching of capacitors. The circuit 10 may be caused to simulate only a bilinear inductor across the nodes 21 and 22 by setting C1=4C2. Alternately, the circuit 10 may be caused to simulate only an LDI or a bilinear inductor by connecting an element having a negative capacitance of the proper value across the nodes 21 and 22. The circuit 10 may also be caused to simulate the parallel combination of a bilinear inductor and a negative capacitor by proper selection of values of the capacitors.

Figure 2:
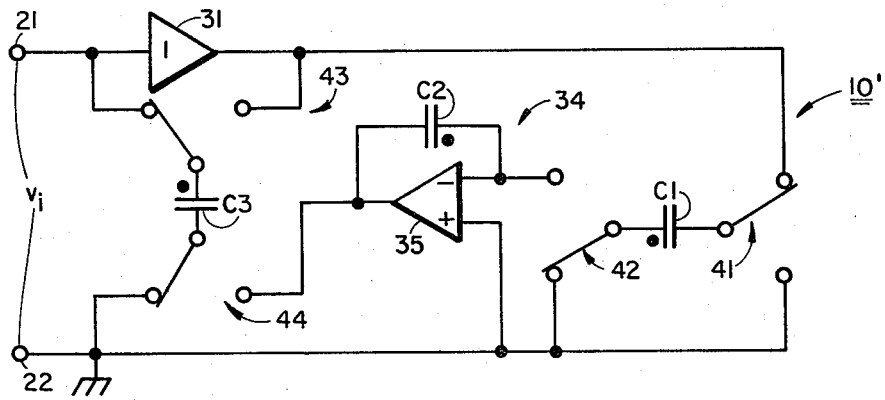
FIG. 2 is a schematic circuit diagram of a switched capacitor circuit for simulating the parallel combination of a grounded inductor and capacitor.
Figure 3:
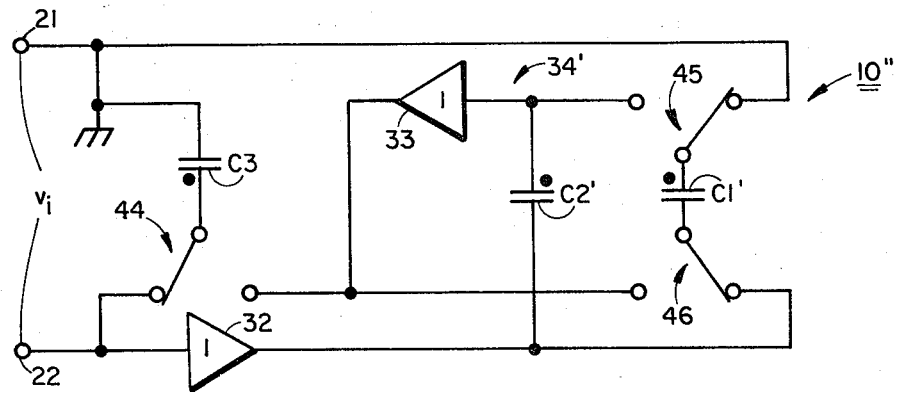
FIG. 3 is a schematic circuit diagram of an alternate embodiment for simulating the parallel combination of a grounded inductor and capacitor.

Although this invention is described in relation to preferred embodiments thereof, variations and modifications will occur to those skilled in the art. By way of example, the simulation circuit in FIG. 1 may be modified for simulating a grounded impedance element consisting of the parallel combination of an inductor and a capacitor by merely replacing the voltage follower 32 with a short circuit and connecting the node 22 to a ground reference potential, as is shown in FIG. 2 where the switch means are illustrated in schematic form. Alternatively, the voltage follower 31 may be replaced with a short circuit and the node 21 connected to ground, as is illustrated in FIG. 3. Also, the simulation circuit may employ a voltage follower type of integrator circuit 34' and switch means 45 and 46 which are associated with the switched capacitor C1'. The integrator means 34' comprises a voltage follower circuit 33 and an integrator capacitor C2' that is electrically connected between the input terminal of this voltage follower and the output terminal of voltage follower 32 in FIG. 3. Since the bottom plate of the integrating capacitor C2' is driven by a voltage source 32, the bottom plate parasitic capacitance of C2' has negligible effect on the operation of the circuit. In this simulation circuit 10Δ, the switch means 45 and 46 are responsive to $\phi 1$ for connecting C1' between node 21 and the output terminal of voltage follower 32. Alternatively, the simulation circuit may employ other types of integrator circuits. Further, the simulation circuit may be realized with integrated circuit technologies other than MOS, in other than fully integrated circuit form, and fully or partially implemented with discrete components. Also, the switch means may comprise other types of switching elements such as discrete transistors, mechanical switches, relays, and other types of integrated switches. Additionally, the circuits 31-33 may comprise other types of voltage followers. Additionally, the duty cycle of the timing control signals may be less than 50%, although it should not exceed this value. The scope of this invention is therefore to be determined from the attached claims rather than from the aforementioned detailed descriptions of preferred embodiments thereof.

What is claimed is:

1. An integratable switched capacitor circuit for simulating an impedance element comprising:
a pair of nodes adapted for receiving an input voltage;
voltage follower means having an input terminal connected to one of the nodes and having an output terminal;
a first capacitor C1;
integrator means including a second capacitor C2, and having an input terminal and an output terminal;
a third capacitor C3;

switch means associated with said first and third capacitors and being periodically operative in first and second non-overlapping switch states; and means for coupling the switch means to the other one of said nodes;

operation of said switch means in the first state electrically connecting said first capacitor between the output terminal of said voltage follower means and said coupling means for sampling and storing an input voltage, and electrically connecting said third capacitor across said nodes for sampling and storing the input voltage; operation of said switch means in the second state electrically connecting said first capacitor to said integrator means for causing it to integrate the charge voltage stored on C1, and electrically connecting said third capacitor between the output terminal of said integrator means and one of the output terminal of said voltage follower means and said coupling means for causing C3 to sample the integrated voltage; the sum of the input voltage and the integrated voltage that is stored by C3 being discharged to a new input voltage when said switch means subsequently operates in the next first state which again connects C3 across said nodes.

2. The circuit according to claim 1 wherein said coupling means comprises a second voltage follower means, the circuit now simulating a floating impedance element which may be the parallel combination of an inductor and a capacitor.

3. The circuit according to claim 1 wherein said coupling means connects said other node to ground, the circuit now simulating a grounded impedance element which may be the parallel combination of an inductor and a capacitor.

4. The circuit according to claim 1 which is implemented in integrated circuit form in which said first and second capacitors are integrated capacitors having the bottom plates thereof either switched between output terminals of voltage sources, switched between ground and the output terminal of a voltage source, or driven by the output of a voltage source, for rendering the circuit substantially insensitive to parasitic capacitance effects associated with the bottom plates of these integrated capacitors.

5. An integratable switched capacitor floating impedance element which may be the parallel combination of an inductor and a capacitor, comprising:

first and second nodes adapted for receiving an input voltage;

first and second voltage follower means having input terminals connected to said first and second nodes, respectively, and having output terminals across which the input voltage is established;

a first capacitor having a capacitance C1;

integrator means including a second capacitor having a capacitance C2 associated therewith, and having an input and an output terminal;

a third capacitor having a capacitance C3; and switch means associated with said first and third capacitors and being periodically operative in first and second non-overlapping switch states; operation of said switch means in the first state electrically connecting said first and third capacitors across the outputs of said voltage followers and across the nodes, respectively, for sampling and storing an input voltage; operation of said switch means in the second state electrically connecting said first capacitor to the input terminal of said integrator means for causing it to integrate the charge on said first capacitor and produce an output voltage that is proportional to the integral of the input voltage that is available at the output terminals of said voltage follower means, and electrically connecting said third capacitor between the output terminal of said integrator means and the output terminal of said first voltage follower means for causing said third capacitor to sample the integrated voltage; subsequent operation of said switch means in the next first state again electrically connecting said third capacitor to the nodes for discharging it from the sum of the input voltage and the integrated voltage to a new input voltage that is applied to the nodes.

6. The circuit according to claim 5 wherein said switch means may complete a cycle of operation in the two switch states every T seconds and $f = 1/T$ is the sampling frequency for the switched capacitors, which frequency is greater than the Nyquist rate.

7. The circuit according to claim 6 wherein said second capacitor is the integrating capacitor of said integrating means and the circuit simulates a floating inductance $TC2/C1C3$ in parallel with a capacitor C3 when the circuit is characterized by the LDI transformation.

8. The circuit according to claim 6 wherein said second capacitor is the integrating capacitor of said integrating means and the circuit simulates a floating inductance $TC2/C1C3$ in parallel with a floating capacitance $C3-(C1C3/4C2)$ when the circuit is characterized by the bilinear transformation.

9. The circuit according to claim 8 wherein $C1 = C2$ for causing the circuit to simulate a floating inductor in the bilinear domain.

10. The circuit according to claim 5 wherein said switch means is operative in the first state for electrically connecting one and other sides of said first capacitor to the output terminals of said first and second voltage follower means, respectively, and is operative in the second state for electrically connecting the other and one terminals of said first capacitor to the input terminal of said integrator means and to the output terminal of said second voltage follower means, respectively.

11. The circuit according to claim 10 wherein said integrator means comprises a differential input operational amplifier having one input terminal electrically connected to the output terminal of said second voltage follower means, said second capacitor being electrically connected between the other input terminal and the output terminal of said amplifier, said switch means being operative in the second state for electrically connecting said first capacitor across the two input terminals of said amplifier for discharging said first capacitor into said second capacitor.

12. The circuit according to claim 5 wherein said integrator means is a voltage follower type of integrator means, said switch means being operative in the second state for electrically connecting said first capacitor across said voltage follower integrator means for causing the latter to integrate the charge voltage on said first capacitor.

13. The circuit according to claim 12 wherein said integrator means comprises a third voltage follower means having an output terminal and having an input terminal that is electrically connected through said second capacitor to the output terminal of said second voltage follower means, operation of said switch means in the second state electrically connecting said first capacitor between the input and output terminals of said third voltage follower means for causing said first capacitor to discharge into said second capacitor.

14. The circuit according to claim 13 wherein said switch means is operative in the first state for electrically connecting one and other sides of said first capacitor to the output terminals of said first and second voltage follower means, respectively, and is operative in the second state for electrically connecting the one and other side of said first capacitor to the input and output terminals, respectively, of said third voltage follower means for causing said first capacitor to discharge into said second capacitor.

15. An integratable switched capacitor circuit for simulating a grounded impedance element which may be the parallel combination of an inductor and a capacitor, comprising:
first and second nodes adapted for receiving an input voltage;
voltage follower means having an input terminal electrically connected to said first node and having an output terminal at which a voltage on said first node is established;
coupling means for coupling said second node to a ground reference potential;
a first capacitor having a capacitance C1;
integrator means including a second capacitor having a capacitance C2 associated therewith, and having an input terminal and an output terminal;
a third capacitor having a capacitance C3; and
switch means associated with said first and third capacitors and being periodically operative in first and second non-overlapping switch states; operation of said switch means in the first state electrically connecting said first capacitor between the output terminal of said voltage follower means and said second node for causing it to sample the input voltage, and electrically connecting said third capacitor across said nodes for causing it to sample the input voltage; operation of said switch means in the second state electrically connecting said first capacitor in said integrator means for causing the latter to integrate the charge on said first capacitor and produce an output voltage that is proportional to the integral of the input voltage, and electrically connecting said third capacitor between the output terminal of said integrator means and one of the output terminal of said voltage follower means and ground for causing said third capacitor to also sample and store the integrated voltage; subsequent operation of said switch means in the next first state again electrically connecting said third capacitor across said nodes for adjusting the charge on said third capacitor to correspond to a new input voltage across said nodes.

16. The circuit according to claim 15 wherein said switch means completes a cycle of operation in the two switch states every T seconds and f=1/T is the sampling frequency for the switched capacitors, which frequency is greater than the Nyquist rate.

17. The circuit according to claim 16 wherein said second capacitor is the integrating capacitor of said integrating means and the circuit simulates a grounded inductance TC2/C1C3 in parallel with a capacitor C3 when the circit is characterized by the LDI transformation.

18. The circuit according to claim 16 wherein said second capacitor is the intergrating capacitor of said integrating means and the circuit simulates a grounded inductance TC2/C1C3 in parallel with a capacitance C3-(C1C3/4C2) when the circuit is characterized by the bilinear transformation.

19. The circuit according to claim 18 wherein C1=4C2 for causing the circuit to simulate a grounded inductor alone in the bilinear domain.

20. The circuit according to claim 15 wherein said switch means is operative in the first state for connecting one and other sides of said first capacitor to the output terminal of said voltage follower means and said second node, respectively; and is operative in the second state for electrically connecting the one and other sides of said first capacitor to said second node and the input terminal of said integrator means, respectively.

21. The circuit according to claim 20 wherein said switch means is operative in the second state for connecting said third capacitor between the output terminal of said integrator means and the output terminal of said voltage follower means.

22. The circuit according to claim 21 wherein said integrator means comprises a differential input operational amplifier having one input terminal electrically connected to said second node, said second capacitor being electrically connected between the other input terminal and the output terminal of said amplifier, operation of said switch means in the second state electrically connecting the one and other sides of said first capacitor between ground and the other input terminal of said amplifier for discharging said first capacitor into said second capacitor.

23. The circuit according to claim 15 wherein said switch means is operative in the first state for connecting one and other sides of said first capacitor to ground and the output terminal of said voltage follower means, respectively, and is operative in the second state for electrically connecting the one and other sides of said first capacitor to the output terminal of said voltage follower means and the input terminal of said integrator means.

24. The circuit according to claim 23 wherein operation of said switch means in the second state connects said third capacitor between the output terminal of said integrator means and ground.

25. The circuit according to claim 24 wherein said integrator means comprises a differential input operational amplifier having one input terminal electrically connected to the output terminal of said voltage follower means, said second capacitor being electrically connected between the other input terminal and the output terminal of said amplifier, operation of said switch means in the second state electrically connecting the one and other sides of said first capacitor to the output terminal of said voltage follower means and the other input terminal of said amplifier for discharging said first capacitor into said second capacitor.

26. The circuit according to claim 15 wherein said integrator means is a voltage follower type of integrator means, operation of said switch means in the second state electrically connecting said first capacitor across said voltage follower integrator means for causing the latter to integrate the charge voltage on said first capacitor.

27. The circuit according to claim 26 wherein said integrator means comprises a second voltage follower means having an input terminal and an output terminal, and connecting means electrically connecting said second capacitor between the input terminal of said second voltage follower means and one of the ground reference potential and the output terminal of said first named voltage follower means, operation of said switch means in the second state electrically connecting said first capacitor between the input and output terminals of said second voltage follower means for causing said first capacitor to discharge into said second capacitor.

* * * * *